United States Patent
Kawai (10) Patent No.: US 9,748,938 B2
(45) Date of Patent: Aug. 29, 2017

(54) CLOCK TRANSMISSION CIRCUIT AND SEMICONDUCTOR INTEGRATED CIRCUIT

(71) Applicant: SOCIONEXT INC., Yokohama-shi, Kanagawa (JP)

(72) Inventor: Shigeaki Kawai, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/153,472

(22) Filed: May 12, 2016

(65) Prior Publication Data
US 2016/0261256 A1    Sep. 8, 2016

Related U.S. Application Data

(63) Continuation of application No. PCT/JP2014/080472, filed on Nov. 18, 2014.

(51) Int. Cl.
| | |
|---|---|
| H03K 3/00 | (2006.01) |
| H03K 5/15 | (2006.01) |
| H04L 25/02 | (2006.01) |
| H04L 25/03 | (2006.01) |
| G06F 1/26 | (2006.01) |

(52) U.S. Cl.
CPC ......... *H03K 5/15033* (2013.01); *G06F 1/266* (2013.01); *H04L 25/02* (2013.01); *H04L 25/03* (2013.01)

(58) Field of Classification Search
CPC .................................................. H03K 5/15033
See application file for complete search history.

(56) References Cited

U.S. PATENT DOCUMENTS

| | | | |
|---|---|---|---|
| 6,538,499 B1 * | 3/2003 | Lu | H03L 7/06 327/156 |
| 2008/0150606 A1 | 6/2008 | Kumata | |
| 2009/0066394 A1 | 3/2009 | Kanda et al. | |
| 2012/0262236 A1 | 10/2012 | Shirai | |

FOREIGN PATENT DOCUMENTS

| | | |
|---|---|---|
| JP | H11-045130 A | 2/1999 |
| JP | 11-252185 A | 9/1999 |
| JP | 2008-160206 A | 7/2008 |
| JP | 2012-227568 A | 11/2012 |
| WO | WO 2007/110915 A1 | 10/2007 |

OTHER PUBLICATIONS

Fukuda et al., "A 12.3mW 12.5Gb/s Complete Transceiver in 65nm CMOS", IEEE International Solid-State Circuits Conference, pp. 368-369, 2010.
International Search Report of related International Patent Application No. PCT/JP2014/080472 dated Dec. 16, 2014.
Written Opinion of related International Patent Application No. PCT/JP2014/080472 dated Dec. 16, 2014.

* cited by examiner

*Primary Examiner* — Daniel Puentes
(74) *Attorney, Agent, or Firm* — Arent Fox LLP (57) ABSTRACT

A clock transmission circuit includes a first buffer, a second buffer, and an inductor unit. The first buffer is configured to receive a first clock which is one of differential clocks, and to buffer and output the first clock to a first clock wiring. The second buffer is configured to receive a second clock which is the other of the differential clocks, and to buffer and output the second clock to a second clock wiring. The inductor unit is connected between a first node of the first clock wiring and a second node of the second clock wiring, and configured to include a center tap to which a common voltage is applied.

21 Claims, 8 Drawing Sheets

CLOCK TRANSMISSION CIRCUIT AND SEMICONDUCTOR INTEGRATED CIRCUIT

CROSS-REFERENCE TO RELATED APPLICATION

This application is a continuation application and is based upon PCT/JP2014/080472, filed on Nov. 18, 2014, the entire contents of which are incorporated herein by reference.

FIELD

Embodiments described herein relate to a clock transmission circuit and a semiconductor integrated circuit.

BACKGROUND

A clock transmission circuit is for transmitting clocks used in a semiconductor integrated circuit (LSI) to each circuit block using clocks from a clock oscillation source, and is widely utilized in various LSIs or the like that use clock signals, including communication LSI and CPU.

In other words, for example, the clock transmission circuit transmits clocks from a clock oscillation source to each circuit block, while maintaining the waveform of the clocks via a plurality of buffers.

Incidentally, in general, clock transmission by the clock transmission circuit is performed, for example, by application of a CMOS inverter or CML (Current Mode Logic). Since parasitic capacitance (load capacitance) is present in the wirings for transmitting clocks and the CMOS inverter (buffer), the load capacitance is charged and discharged during transmission of the clocks, so that the consumption current is increased. For example, when clock transmission is performed by application of CMOS inverter, the consumption current becomes proportional to the load capacitance and frequency.

Further, in recent years, as the processing speed and communication speed of a CPU are increased, the frequency of the internal clock in a LSI has been increased to several GHz or higher. Since the consumption current is proportional to the frequency as described above, when the frequency of the internal clock is increased to several GHz or higher, an increase in the consumption current in the clock transmission circuit becomes a problem.

As a method for performing clock transmission with low consumption power, a technique referred to as inductor peaking (Resonant Clock Distribution) has been proposed. Inductor peaking is also referred to as clock transmission by resonance.

Inductor peaking is a technique in which an inductor is, for example, located in parallel with the load capacitance to generate parallel resonance, so that the impedance seen by the buffer of the clock transmission circuit is increased and clock transmission is performed by making the load capacitance appear to be low.

Although, as described above, a clock transmission circuit for performing clock transmission using inductor peaking has been proposed, in such a clock transmission circuit, a common voltage (bias voltage) is, for example, applied by high resistance bias.

In other words, in order to set the common voltage to be a desired value, it has been the practice to add a capacitance or resistance element to the signal line for transmitting a high-speed signal (clock), for example, thereby providing a bias by an operational amplifier or resistor.

To reduce the influence on the transmitted clocks as much as possible, there is a technique to provide a bias via a high resistance element, i.e., a technique to set up the common voltage by increasing the impedance. Meanwhile, when the common voltage is set up by decreasing the impedance, a large influence is imparted to the transmitted differential (complementary) clocks, and therefore it is not usually practiced.

However, with the technique to provide a bias via high resistance elements, since the high resistance elements are formed in a semiconductor substrate (formed on a semiconductor chip), for example, addition of parasitic capacitance of several fF-several 100 fF is not avoidable, so that the band of the clock transmission circuit is reduced.

Further, when the impedance is increased, for example, increased susceptibility to external noise occurs, and in addition, jitter is caused in the transmitted clocks due to noise of the common voltage or a situation might occur in which the duty ratio is deviated.

Incidentally, in the past, various proposals have been made to perform clock transmission using an inductor peaking technique.

Patent Document 1: Japanese Laid-open Patent Publication No. H11(1999)-252185

Non-Patent Document 1: Fukuda et al., "A 12.3 mW 12.5 Gb/s Complete Transceiver in 65 nm CMOS," Solid-State Circuits IEEE International Conference-ISSCC, pp. 368-369, February, 2010

SUMMARY

According to an aspect of the embodiments, there is provided a clock transmission circuit includes a first buffer, a second buffer, and an inductor unit. The first buffer is configured to receive a first clock which is one of differential clocks, and to buffer and output the first clock to a first clock wiring.

The second buffer is configured to receive a second clock which is the other of the differential clocks, and to buffer and output the second clock to a second clock wiring. The inductor unit is connected between a first node of the first clock wiring and a second node of the second clock wiring, and configured to include a center tap to which a common voltage is applied.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
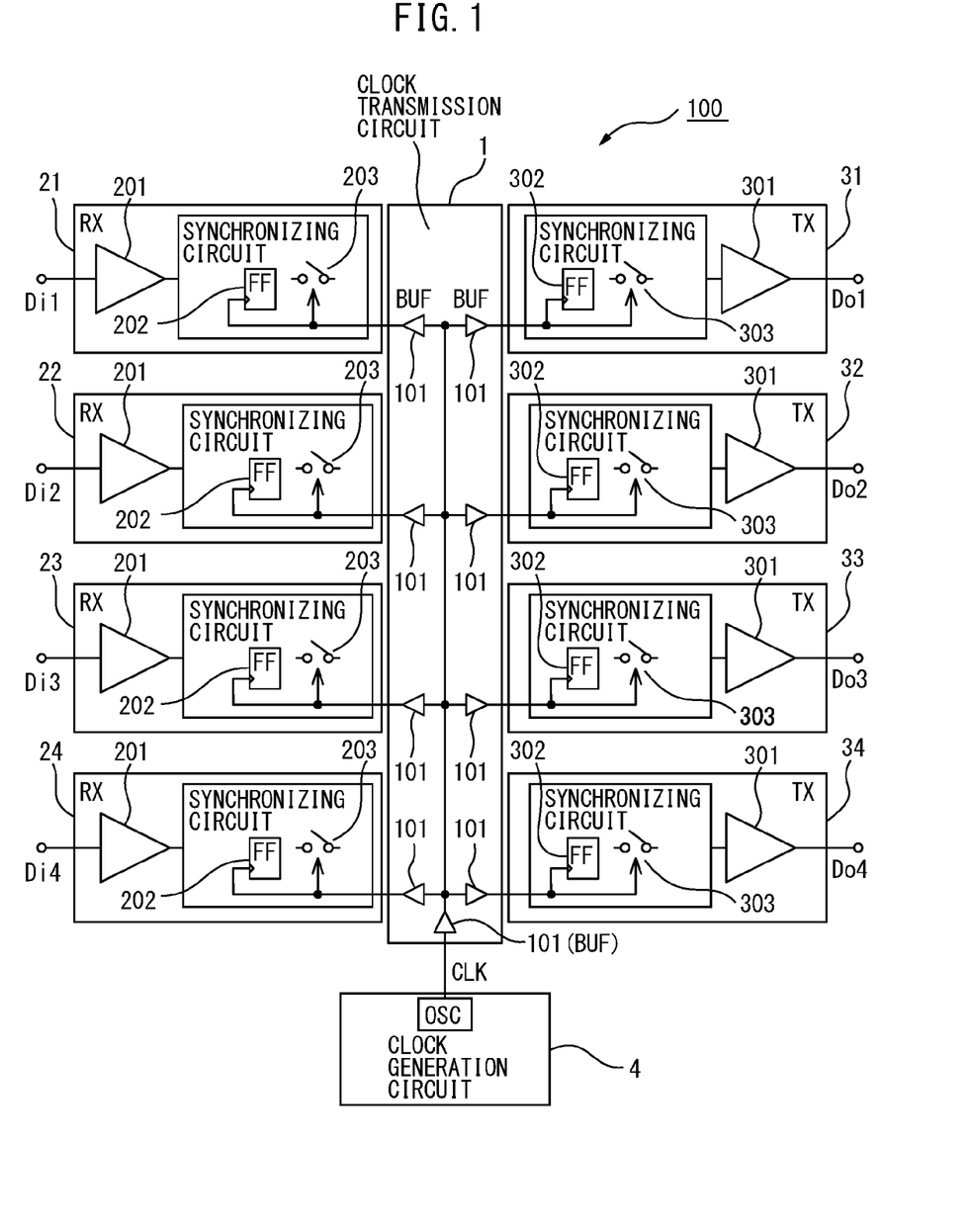
FIG. 1 is a block diagram illustrating an example of a semiconductor integrated circuit to which a clock transmission circuit is applied.

First, before describing embodiments of the clock transmission circuit and the semiconductor integrated circuit in detail, examples of the clock transmission circuit and the semiconductor integrated circuit and problems thereof will be described with reference to FIG. 1 to FIG. 4. FIG. 1 is a block diagram illustrating an example of the semiconductor integrated circuit to which the clock transmission circuit is applied, and illustrating an example of a communication semiconductor integrated circuit (communication LSI).

As depicted in FIG. 1, the communication LSI 100 includes a clock transmission circuit 1, a plurality of data receiving circuits (RXs) 21-24, a plurality of data transmission circuits (TXs) 31-34, and a clock generation circuit (clock oscillation source: oscillator OSC) 4.

The clock generation circuit 4 generates a clock CLK by a PLL (Phase Locked Loop), for example, and inputs it to the clock transmission circuit 1. The clock transmission circuit 1 includes a plurality of buffers (BUFs) 101, and transmits the clock CLK to the respective data receiving circuits 21-24 and the respective data transmission circuits 31-34 via these buffers 101.

The data receiving circuits 21 (21-24) each have a similar configuration, and include, for example, a buffer 201, a flip-flop (FF) 202, and a switch 203. The clock CLK from the clock transmission circuit 1 is, for example, used as a control signal for the flip-flop 202 and the switch 203 which constitute a synchronizing circuit.

The data receiving circuits 21-24 receive and amplify input data (received signals) Di1-Di4 at the buffers 201 and reproduce the received signals Di1-Di4 by the synchronizing circuits of the flip-flops 202 and the switches 203 based on the clock CLK, respectively.

The data transmission circuits 31 (31-34) each have a similar configuration, and include, for example, an amplifier 301, a flip-flop (FF) 302, and a switch 303. The clock CLK from the clock transmission circuit 1 is, for example, utilized as a control signal for the flip-flop 302 and the switch 303 which constitute a synchronizing circuit.

The data transmission circuits 31-34 output output data (transmission signals) Do1-Do4, each of which has been processed by the synchronizing circuit of the flip-flop 302 and the switch 303 based on the clock CLK and then amplified by the amplifier 301.

In this manner, the clock transmission circuit 1 transmits the clock CLK from the clock generation circuit 4 to the respective data receiving circuits 21-24 (202, 203) and the respective data transmission circuits 31-34 (302, 303) using clocks.

Incidentally, FIG. 1 schematically illustrates the communication LSI 100; in actuality, the clock CLK from the clock transmission circuit 1 is transmitted not only to the flip-flop and the switch in each data receiving circuit and each data transmission circuit but also to various circuit blocks.

Figure 2:
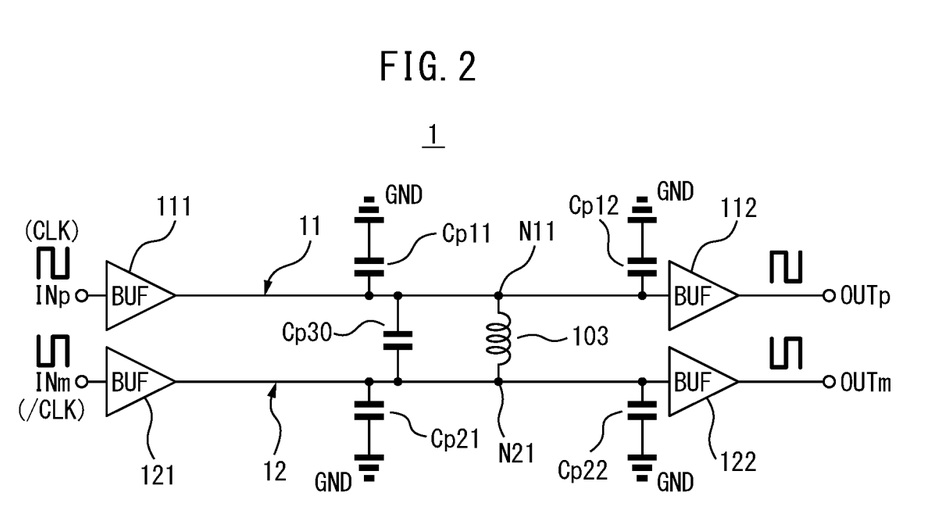
FIG. 2 is a view for explaining an example of the clock transmission circuit illustrated in FIG. 1.

FIG. 2 is a view for explaining an example of the clock transmission circuit illustrated in FIG. 1, and illustrates the example of the clock transmission circuit in which clock transmission is performed via application of the inductor peaking technique. In FIG. 2, reference numerals 11 and 12 indicate wirings (clock wirings), 111, 112, 121, and 122 indicate buffers (BUFs), 103 indicates an inductor, and Cp11, Cp12, Cp21, Cp22, and Cp30 indicate parasitic capacitances.

Incidentally, the inductor peaking is a technique in which clock transmission is performed with the inductor being provided in parallel with a load capacitance to generate a parallel resonance as described above, for example, thereby increasing the impedance seen by the buffer of the clock transmission circuit.

As depicted in FIG. 2, the clock transmission circuit 1 receives differential (complementary) clocks CLK and /CLK at input terminals INp and INm, and outputs the clocks from output terminals OUTp and OUTm through the buffers 111 and 112, the clock wirings 11 and 12, and the buffers 121 and 122.

For example, capacitances (parasitic capacitances) Cp11 and Cp12 are present between the clock wiring 11 and the earth (ground) GND, capacitances Cp21 and Cp22 are present between the clock wiring 12 and the earth GND, and a capacitance Cp30 is present between the clock wirings 11 and 12. Incidentally, for example, the capacitance Cp30 may be an intentionally provided capacitance instead of the capacitance parasitic between the clock wirings 11 and 12.

The inductor 103 is connected to a node N11 of the clock wiring 11 between the buffers 111 and 112 that transmits the positive-logic clock CLK and to a node N21 of the clock wiring 12 between the buffers 121 and 122 that transmits the negative-logic clock /CLK.

In other words, it is configured such that the inductor 103, which is provided between the clock wirings 11 and 12, generates a parallel resonance with the load capacitances (parasitic capacitances Cp11, Cp12, Cp21, Cp22, and Cp30), so that, for example, the values of the load capacitances seen by the buffers 111 and 121 are made to appear to be smaller.

Let it be assumed that the frequency of the clock CLK is f, the capacitance value of the load capacitor is C, and the inductance of the inductor 103 is L; then, an optimum value of L is given by the following equation:

$$L = 1/(4\pi^2 f^2 C)$$

By providing the instructor 103 having such optimum inductance L between the clock wirings 11 and 12, it is possible, for example, to reduce the size of the front-stage buffers 111 and 121, so that the consumption current may be decreased.

Incidentally, with a clock transmission circuit that transmits a clock having a frequency lower than 1 GHz, for example, a consumption current in the clock transmission circuit has seldom become a problem. Further, in a clock transmission circuit to which inductor peaking is applied, when a clock having a low frequency is transmitted, it has been difficult to form an inductor 103 having an optimum value of L in an LSI (semiconductor substrate: chip) due to the problem of the occupied area, for example.

Specifically, when f=0.5 GHz and C=1 pF, for example, it follows that L=0.1 µH; thus, it has been difficult to realize the inductor in a chip. However, when the operating speed becomes higher by ten times, it follows that L=1 nH, wherein f=5 GHz and C=1 pF.

The inductor 103 having L=1 nH may be realized with several 100 µm², for example. Further, it is considered that a clock transmission circuit to which inductor peaking is applied may be widely applied to LSIs for which further speed-up is expected as the processing speed and communication speed of a future CPU are increased.

Figure 3:
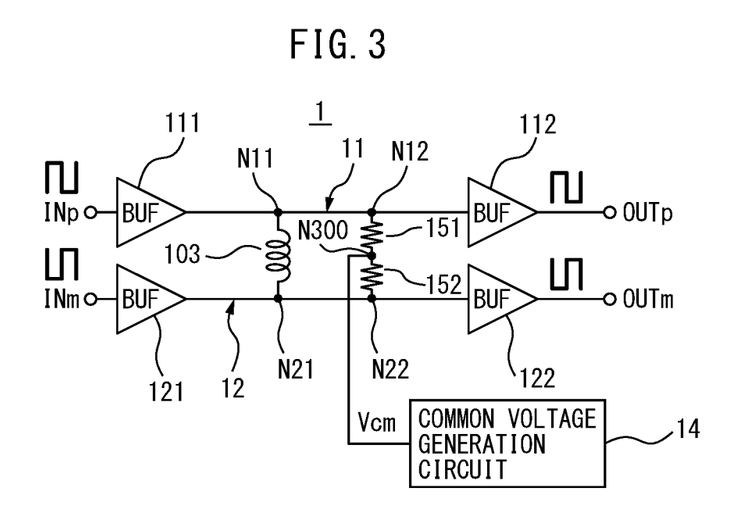
FIG. 3 is a view for explaining application of a common voltage in the clock transmission circuit illustrated in FIG. 2.

FIG. 3 is a view for explaining application of a common voltage in the clock transmission circuit illustrated in FIG. 2. Incidentally, in FIG. 3, the load capacitances in FIG. 2 (parasitic capacitances Cp11, Cp12, Cp21, Cp22, and Cp30) are omitted.

As apparent from a comparison of FIG. 3 with FIG. 2 described above, the clock transmission circuit 1 illustrated in FIG. 3 includes resistors 151 and 152 provided in series between the clock wirings 11 and 12, and a common voltage generation circuit 14 that generates a common voltage Vcm.

One end of the resistor 151 is connected to the node N11 of the clock wiring 11, one end of the resistor 152 is connected to the node N21 of the clock wiring 12, and the other ends of the resistors 151 and 152 are connected in common at a node N300. Further, the common voltage Vcm from the common voltage generation circuit 14 is applied to the common connection node N300 between the resistors 151 and 152.

As will be appreciated, the clock transmission circuit illustrated in FIG. 3 is equivalent to that to which is applied a technique in which bias is provided via the above-described high resistance elements (151 and 152: several tens KΩ to several hundreds KΩ, for example) (the common voltage is set up with increased impedance).

However, with the technique in which bias is provided via high resistance elements, since the high resistance elements are formed on a semiconductor chip, it is not possible to avoid providing parasitic capacitance of about several fF to several hundreds fF, for example, so that the band of the clock transmission circuit is reduced.

Incidentally, when the impedance is enhanced, there is, for example, a tendency that susceptibility to influence of external noise is increased and further due to noise of the common voltage, jitter is caused in the transmitted clock, so that the duty ratio may possibly be deviated.

Figure 4:
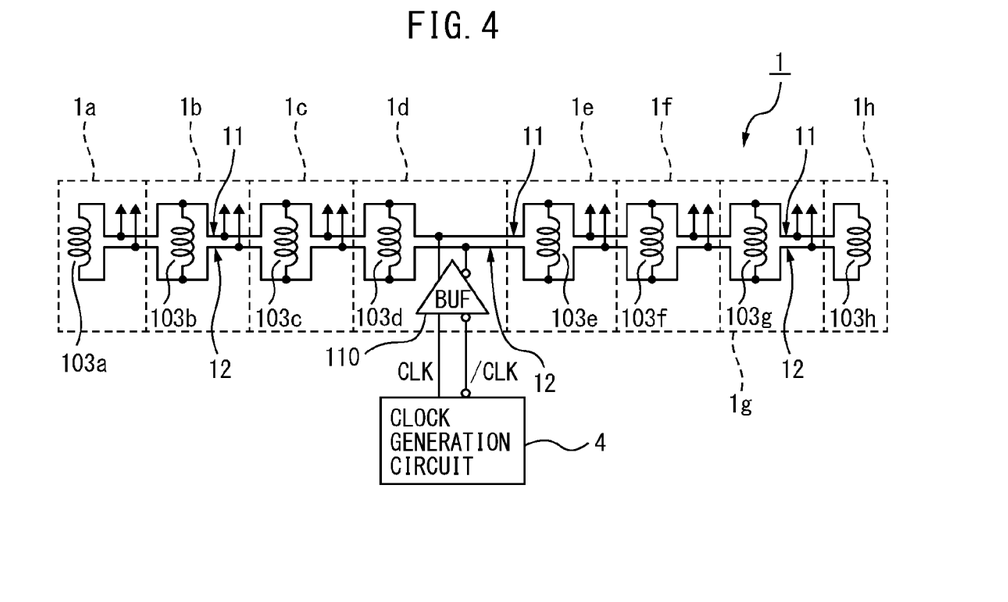
FIG. 4 is a view for explaining another example of the clock transmission circuit illustrated in FIG. 1.

FIG. 4 is a view for explaining another example of the clock transmission circuit illustrated in FIG. 1. As depicted in FIG. 4, the clock transmission circuit 1, for example, performs buffering (e.g., waveform shaping and amplifying) of differential clocks CLK and /CLK from the clock generation circuit 4 by a buffer (BUF) 110, and then transmits the differential clocks to respective internal circuits 1a-1h.

In example of FIG. 4, inductors 103a-103h are provided with respect to the plurality of internal circuits 1a-1h (e.g., data transmission circuits TX) in the clock wirings 11 and 12 that transmit differential clocks CLK and /CLK, respectively. Incidentally, the internal circuit 1h may be a dummy circuit of the data transmission circuit, for example.

Figure 5:
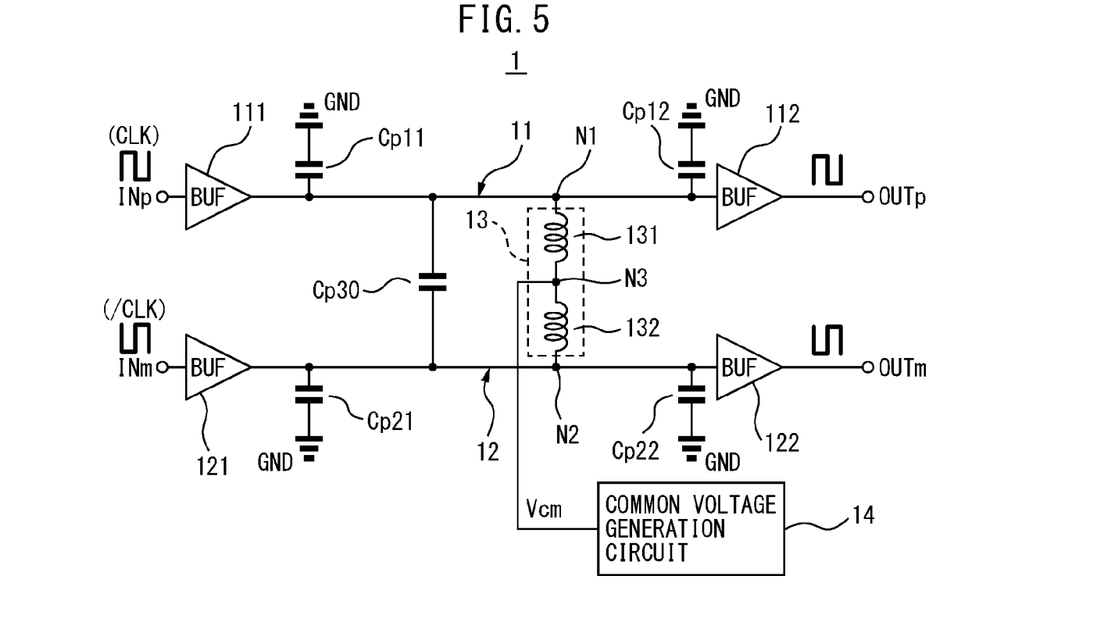
FIG. 5 is a block diagram illustrating a first embodiment of the clock transmission circuit.

Hereinafter, embodiments of a clock transmission circuit and a semiconductor integrated circuit will be described in detail with reference to the accompanying drawings. FIG. 5 is a block diagram illustrating a first embodiment of the clock transmission circuit. As apparent from a comparison of FIG. 5 with FIG. 2 and FIG. 3 described above, the clock transmission circuit 1 of the first embodiment applies the common voltage Vcm to a connection node N3 between inductors 131 and 132 provided in series between the clock wirings 11 and 12.

In other words, one of the differential clocks, or the first clock CLK is inputted from the input terminal INp to the first buffer 111 to be subjected to buffering (e.g., waveform-shaping and amplification), and then outputted from the output terminal OUTp via the first clock wiring 11 and the third buffer 112.

Further, the other of the differential clocks, or the second clock /CLK is inputted from the input terminal INm to the second buffer 121 to be subjected to buffering, and then outputted from the output terminal OUTm via the second clock wiring 12 and the fourth buffer 122.

An inductor unit 13 includes the first inductor 131 and the second inductor 132, wherein one end of the first inductor 131 is connected to a first node N1 of the first clock wiring 11, and one end of the second inductor 132 is connected to a second node N2 of the second clock wiring 12.

The other end of the first inductor 131 and the other end of the second inductor 132 are connected in common at a third node N3, and the common voltage Vcm generated by the common voltage generation circuit 14 is applied to the third node N3.

Incidentally, the first inductor 131 and the second inductor 132 have the same inductance. In FIG. 5, reference symbols Cp11, Cp12, Cp21, Cp22, and Cp30 represent parasitic capacitances (load capacitances). Further, similarly to what has been described with reference to FIG. 2, for example, the capacitance Cp30 is not the capacitance parasitic between the clock wirings 11 and 12 but an intentionally provided capacitance.

The inductors 131 and 132 are located in parallel to the load capacitors (Cp11, Cp12, Cp21, Cp22, and Cp30) so as to generate a parallel resonance, which allows the clocks to be transmitted using inductor peaking which increases the impedance seen by the buffers 111 and 121 of the clock transmission circuit 1.

In other words, in the clock transmission circuit of the first embodiment, the common voltage Vcm to be generated by the common voltage generation circuit 14 and applied as bias is applied to the common connection node N3 between the inductors 131 and 132 of the same impedance.

As such, the node N3 becomes the differential center of the differential clocks CLK and /CLK so that no differential signal appears, and thus even in a state in which a low-impedance circuit or a large parasitic capacitance is attached, it is possible to prevent an adverse influence from being imparted to the transmitted differential clocks CLK and /CLK.

Thus, according to the clock transmission circuit of the first embodiment, it is possible to perform stable clock transmission by restraining occurrence of jitter and deviation of the duty ratio, without using high resistance elements such as described by reference to FIG. 3, and without causing the band of the clock transmission circuit to be reduced.

Figure 6:
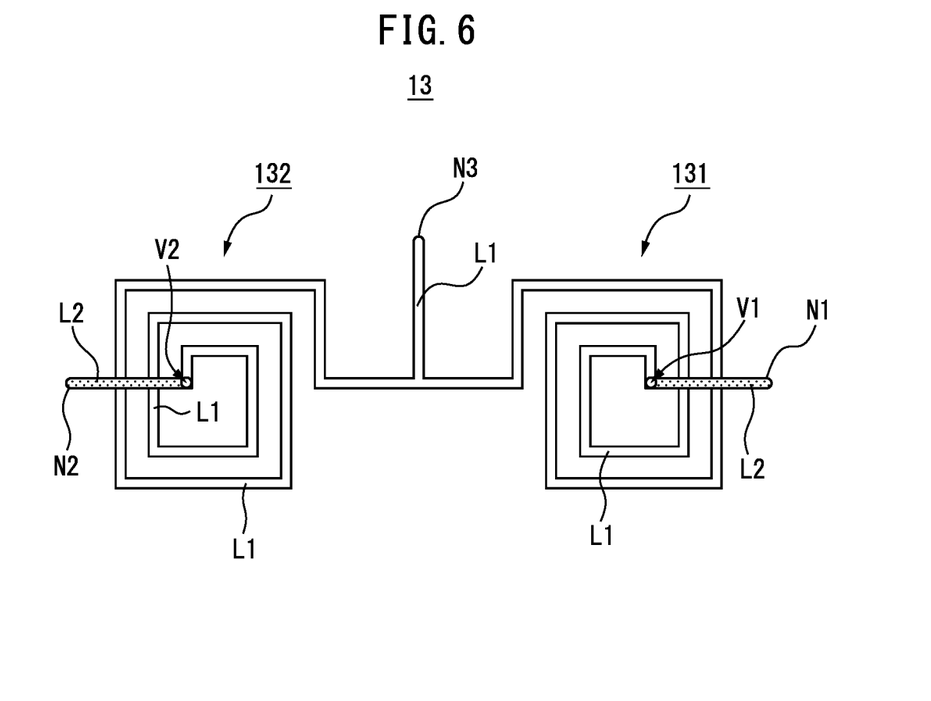
FIG. 6 is a view for explaining an example of an inductor that is applied to the clock transmission circuit illustrated in FIG. 5.

FIG. 6 is a view for explaining an example of the inductor applied to the clock transmission circuit illustrated in FIG. 5. In FIG. 6, reference symbol L1 indicates, for example, a first-layer conductive layer (metal layer) on a semiconductor chip (semiconductor substrate or die), and L2 denotes a second-layer conductive layer on the conductive layer L1. Further, reference symbols V1 and V2 indicate vias (contact holes) which electrically connect the first-layer conductive layer L1 and the second-layer conductive layer L2.

As depicted in FIG. 5 and FIG. 6, the inductor unit 13 in the clock transmission circuit of the first embodiment includes the two inductors 131 and 132, and the first inductor 131 and the second inductor 132 are formed to become a symmetrical structure on the semiconductor chip.

In other words, since the differential signals (clocks CLK and /CLK) are inputted to the nodes N1 and N2 of the two inductors 131 and 132 which are symmetrically structured and have the same inductance, the node N3 becomes the differential center. As such, bias due to the common voltage Vcm is applied to the node N3 which is the differential center.

The first clock wiring 11 is, for example, connected to end (first node N1) of the second-layer conductive layer L2 in the first inductor 131, and the second clock wiring 12 is, for example, connected to the end (second node N2) of the second-layer conductive layer L2 in the second inductor 132.

The common voltage Vcm generated by the common voltage generation circuit 14 is, for example, applied to the node N3 formed by the first-layer conductive layer L1. Incidentally, the inductor unit 13 illustrated in FIG. 6 is merely by way of example, and various modifications and changes are additionally possible.

Figure 7:
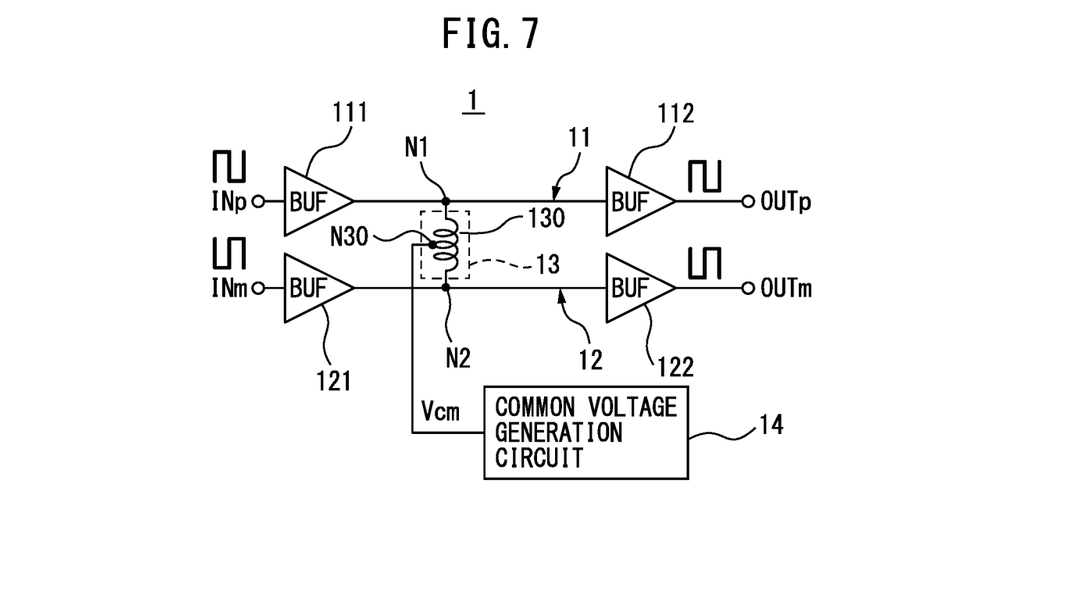
FIG. 7 is a block diagram illustrating a second embodiment of the clock transmission circuit.
Figure 8:
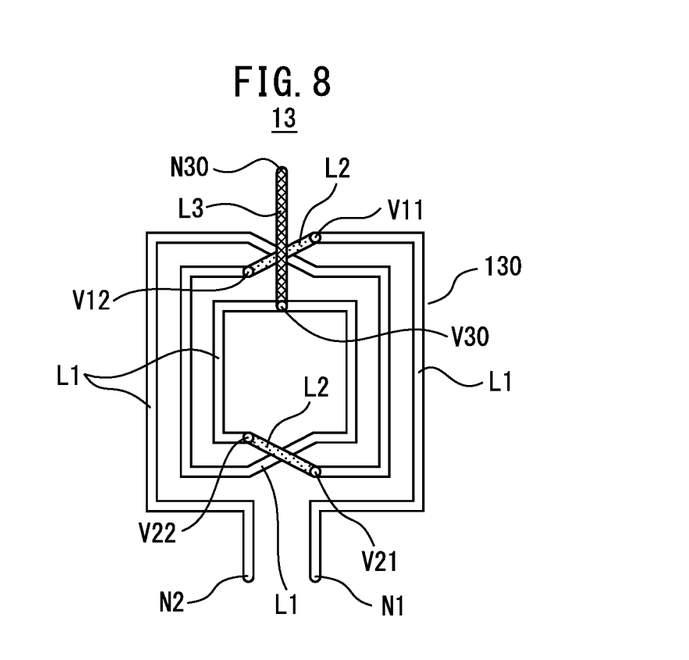
FIG. 8 is a view for explaining an example of an inductor that is applied to the clock transmission circuit illustrated in FIG. 7.

FIG. 7 is a block diagram illustrating a second embodiment of the clock transmission circuit, and FIG. 8 is a view for explaining an example of an inductor (center-tapped (common) inductor 130) applied to the clock transmission circuit illustrated in FIG. 7. Incidentally, in FIG. 7, the load capacitances Cp11, Cp12, Cp21, Cp22, and Cp30 illustrated in FIG. 5 are omitted, and the omission of the load capacitances also applies to FIG. 9 to FIG. 13 which will be described hereinafter.

In FIG. 8, reference symbol L1 indicates, for example, a first-layer conductive layer on a semiconductor chip, L2 indicates a second-layer conductive layer on the conductive layer L1, and L3 indicates a third-layer conductive layer on the conductive layer L2.

Reference symbols V11, V12, V21, and V22 indicate vias which connect the first-layer conductive layer L1 and the second-layer conductive layer L2, and V30 indicates a via which connects the first-layer conductive layer L1 and the third-layer conductive layer L3.

As apparent from a comparison of FIG. 7 and FIG. 8 with FIG. 5 and FIG. 6 described above, in the clock transmission circuit 1 of the second embodiment, the inductor unit 13 is configured of a single inductor (center-tapped inductor) 130 having a center tap (the center tap: a third node) N30.

In other words, in the center-tapped inductor 130, the first inductor 131 of FIG. 5 corresponds to the portion between the first node N1 of the first clock wiring 11 and the center tap N30, and the second inductor 132 of FIG. 5 corresponds to the portion between the second node N2 of the second clock wiring 12 and the center tap N30.

Accordingly, in the center-tapped inductor 130 illustrated in FIG. 8, it is configured such that the inductor corresponding to from the first node N1 to the center tap N30 and the inductor corresponding to from the second node N2 to the center tap N30 have the same inductance.

Incidentally, as apparent from a comparison of FIG. 8 with FIG. 6 described above, it is possible to reduce the occupied area by configuring the inductor unit 13 as the single center-tapped inductor 130 including the center tap N30 rather than by configuring the inductor unit of the two inductors 131 and 132.

As illustrated in FIG. 7 and FIG. 8, the inductor unit 13 in the clock transmission circuit of the second embodiment includes the single center-tapped inductor 130, and the portion corresponding to the first and second inductors 131 and 132 described above is symmetrically structured on the semiconductor chip.

In other words, since the differential signals (CLK and /CLK) are inputted to the nodes N1 and N2 of the portion corresponding to the two inductors 131 and 132 which are symmetrically structured and have the same inductance, the node N30 becomes the differential center. Thus, the bias by the common voltage Vcm is applied to the node N30 which is the differential center.

The first clock wiring 11 is, for example, connected to one end (the first node N1) of the first-layer conductive layer L1 in the center-tapped inductor 130, and the second clock wiring 12 is, for example, connected to the other end (the second node N2) of the first-layer conductive layer L1 in the center-tapped inductor 130.

Further, the common voltage Vcm generated by the common voltage generation circuit 14 is, for example, applied to the node N30 formed by the third-layer conductive layer L3. Incidentally, the inductor unit 13 illustrated in FIG. 8 is merely by way of example, and of course, various changes and modifications are possible.

Further, although, in FIG. 5 and FIG. 7 described above, the inductor unit 13 is provided between the two stage buffers 111, 121 and 112, 122 to which the differential clocks CLK and /CLK are transmitted, it is also possible that the inductor unit 13 may be, for example, provided at a plurality of positions as in FIG. 4 described above. For example, the inductor unit 13, to which the common voltage Vcm is applied, may be applied as the inductors 103a-103h in FIG. 4.

Although, in FIG. 9 to FIG. 13 described below, the inductor unit 13 is depicted as the single center-tapped inductor 130 having the center tap N30 as in the second embodiment described above, it goes without saying that the inductor unit 13 may configured of the two inductors 131 and 132 as in the first embodiment.

Figure 9:
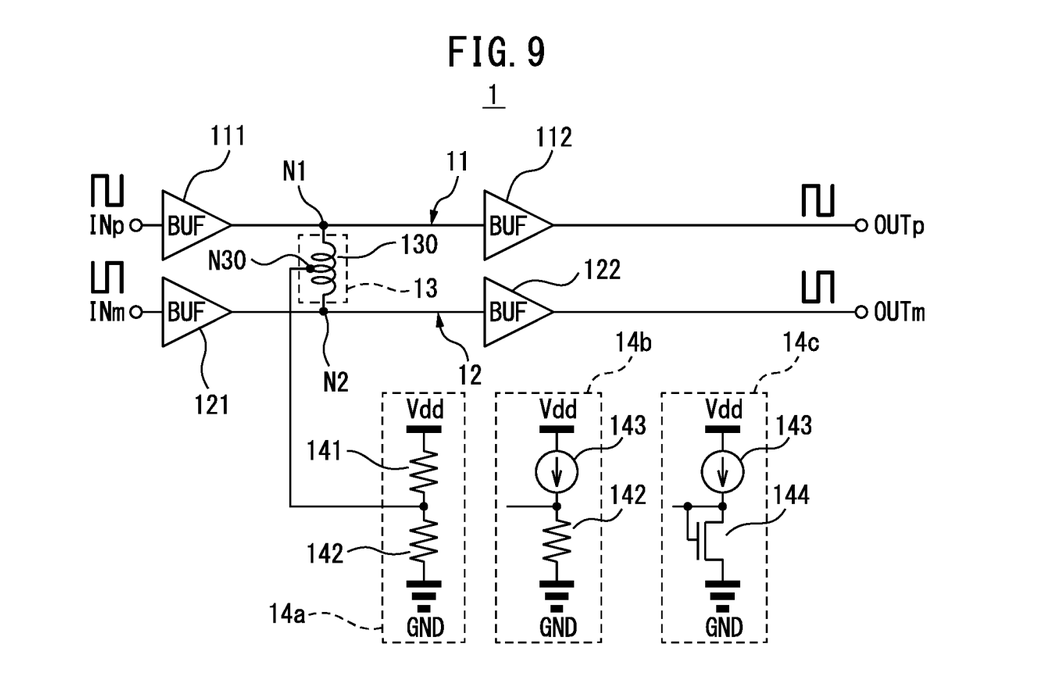
FIG. 9 is a view for explaining an example of a common voltage generation circuit in the clock transmission circuit illustrated in FIG. 7.

FIG. 9 is a view for explaining an example of the common voltage generation circuit in the clock transmission circuit illustrated in FIG. 7, wherein three examples 14a, 14b, and 14c of the common voltage generation circuit 14 are illustrated.

In other words, the common voltage generation circuit 14a is, for example, configured such that resistors 141 and 142 are connected in series to a high-potential power supply line Vdd and a low-potential power supply line (ground line) GND, and a voltage divided by resistance division by the resistors is generated as the common voltage Vcm.

The common voltage generation circuit 14b is, for example, configured such that a current source 143 and a resistor 142 are connected in series between Vdd and GND, and the common voltage Vcm results from a current flowing through the resistor 142.

Further, the common voltage generation circuit 14c is, for example, configured such that a current source 143 and a transistor (nMOS transistor) 144 having a gate and a source connected to each other are connected in series between Vdd and GND, and a voltage across the transistor 144 is generated as the common voltage Vcm. Incidentally, the common voltage Vcm generated by each of the common voltage generation circuits 14a-14c is, for example, set to be the intermediate potential (common potential) between the differential clocks CLK and /CLK.

Figure 10:
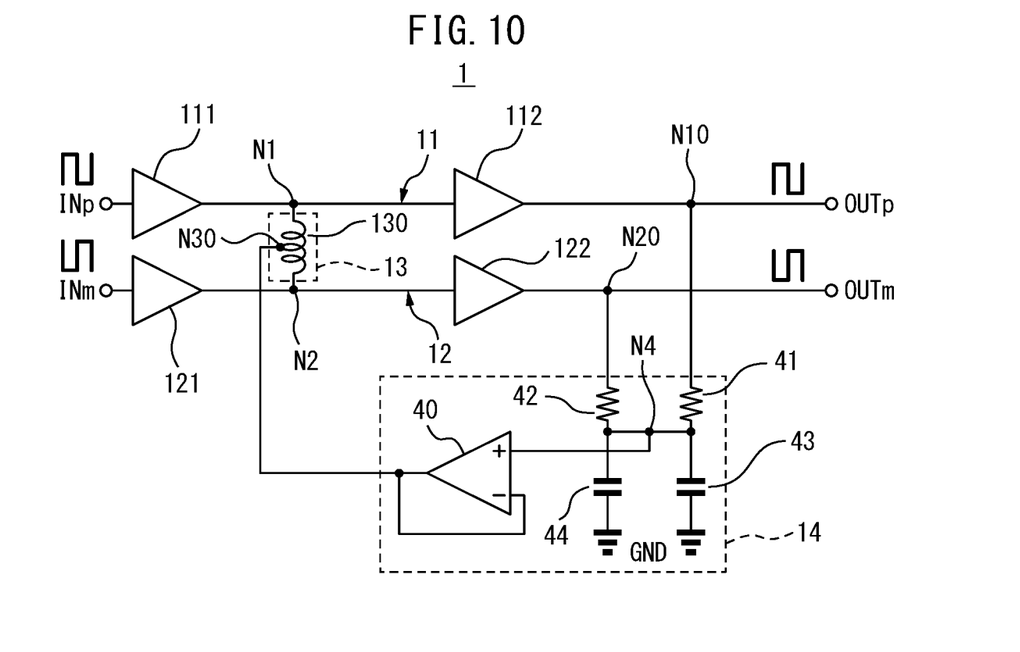
FIG. 10 is a block diagram illustrating a third embodiment of the clock transmission circuit.

FIG. 10 is a block diagram illustrating a third embodiment of the clock transmission circuit, wherein the common voltage generation circuit 14 is configured to generate the common voltage Vcm by feeding back the outputs of the post-stage buffers (112, 122).

As depicted in FIG. 10, the common voltage generation circuit 14 includes an operational amplifier 40, resistors 41 and 42, and capacitors 43 and 44. The resistor (first resistance element) 41 and the capacitor (third capacitance element) 43 are connected in series between output wiring (node N10) of the third buffer 112 and the ground line GND.

Further, the resistor (second resistance element) 42 and the capacitor (third capacitance element) 44 are connected in series between output wiring (node N20) of the fourth buffer 122 and the ground line GND. Incidentally, the capacitors 43 and 44 may be formed by a single capacitor.

A common connection node N4 of the resistor 41, the capacitor 43, the resistor 42, and the capacitor 44 is inputted to a non-inverting input terminal (+) of the operational amplifier 40, and an inverting input terminal (−) of the operational amplifier 40 is connected to an output terminal from which the common voltage Vcm is outputted.

In other words, based on voltages at the outputs of the post-stage third buffer 112 and fourth buffer 122, the common voltage Vcm is generated and fed back to the node (center tap) N30. Incidentally, the common voltage generation circuit 14 illustrated in FIG. 10 is merely by way of example, and various modifications and changes are possible.

Figure 11:
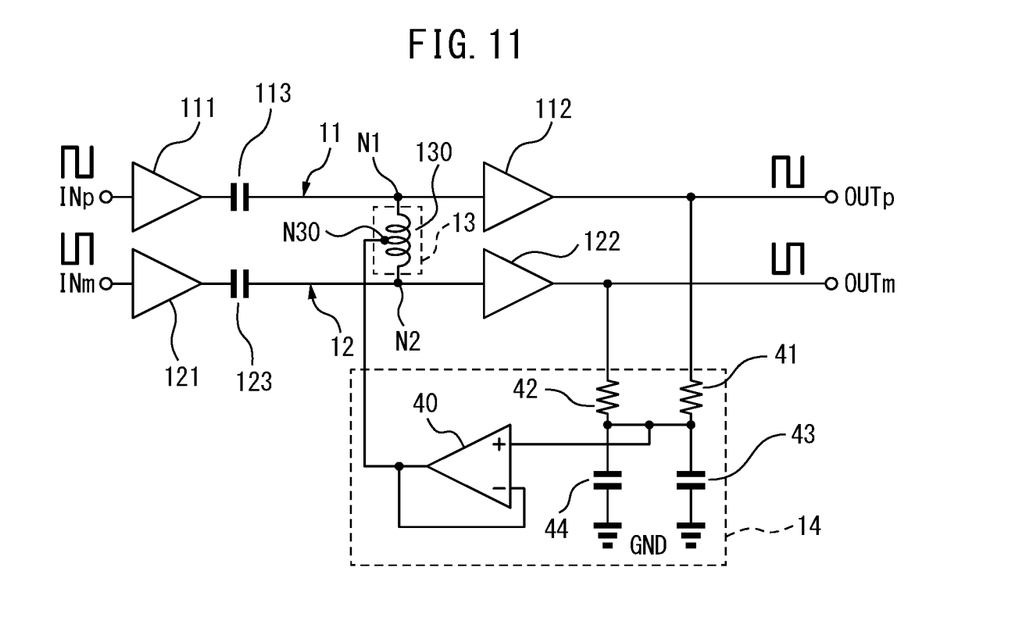
FIG. 11 is a block diagram illustrating a fourth embodiment of the clock transmission circuit.

FIG. 11 is a block diagram illustrating a fourth embodiment of the clock transmission circuit, which is configured such that outputs of the post-stage buffers (112, 122) are AC-coupled so as to restrain an increase in consumption power without reducing the output impedance of the operational amplifier 40.

In the clock transmission circuit of the fourth embodiment, a capacitance (first capacitance element) 113 is provided between the first buffer 111 and the first clock wiring 11, and a capacitance (second capacitance element) 123 is provided between the second buffer 121 and the second clock wiring 12.

Figure 12:
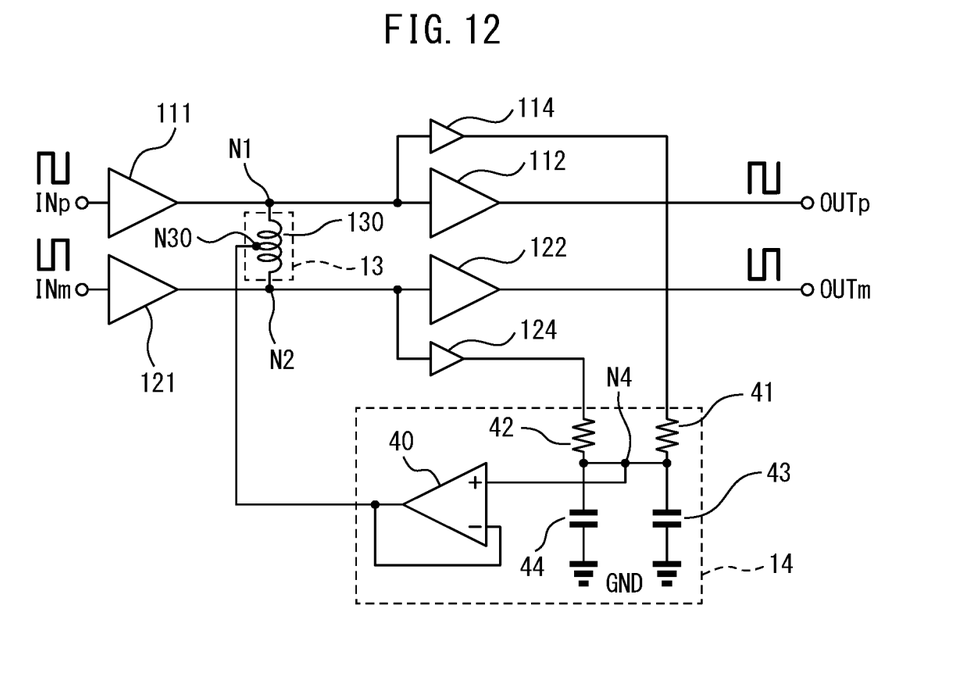
FIG. 12 is a block diagram illustrating a fifth embodiment of the clock transmission circuit.

FIG. 12 is a block diagram illustrating a fifth embodiment of the clock transmission circuit, which corresponds to the clock transmission circuit of the third embodiment in FIG. 10 to which a fifth buffer 114 and a sixth buffer 124 are added.

The fifth buffer 114 is configured of a transistor which is smaller in size, i.e., shorter in gate width than that of the third buffer 112, and the sixth buffer 124 is configured of a transistor which is smaller in size, i.e., shorter in gate width that that of the fourth buffer 122. Incidentally, to the common voltage generation circuit 14 are inputted outputs of the buffers 114 and 124 instead of outputs of the buffers 111 and 121.

In other words, in the fifth embodiment, the common voltage generation circuit 14 generates the common voltage Vcm using the outputs of the special-purpose, small-sized buffers 114 and 124; thus, there is no possibility that an adverse influence is imparted to the outputs of the buffers 112 and 122 which transmit the differential clocks CLK and /CLK.

The fifth and sixth buffers 114 and 124 for the common voltage generation circuit 14 do not drive the clock wirings with load capacitances for transmitting the differential clocks CLK and /CLK and thus may be small size and low power consumption buffers.

In other words, the fifth and sixth buffers 114 and 124 may enough be small size buffers, which are shrinked to the extent that no influence is provided by the capacitance characteristics, instead of being the same as the third and fourth buffers 112 and 122.

In this manner, according to the clock transmission circuit of the fifth embodiment, it is possible to apply the common voltage Vcm from the common voltage generation circuit 14 to the center tap (N30) of the inductor 130 without influencing the transmitted differential clocks.

As described above in detail, according to the clock transmission circuit of the present embodiment, a decrease in the operating band may be restrained, and thus high-speed clock transmission becomes possible. Further, according to the clock transmission circuit of the present embodiment, occurrence of jitter and deviation of duty ratio due to common mode noise may be restrained, and thus stable clock transmission becomes possible.

Figure 13:
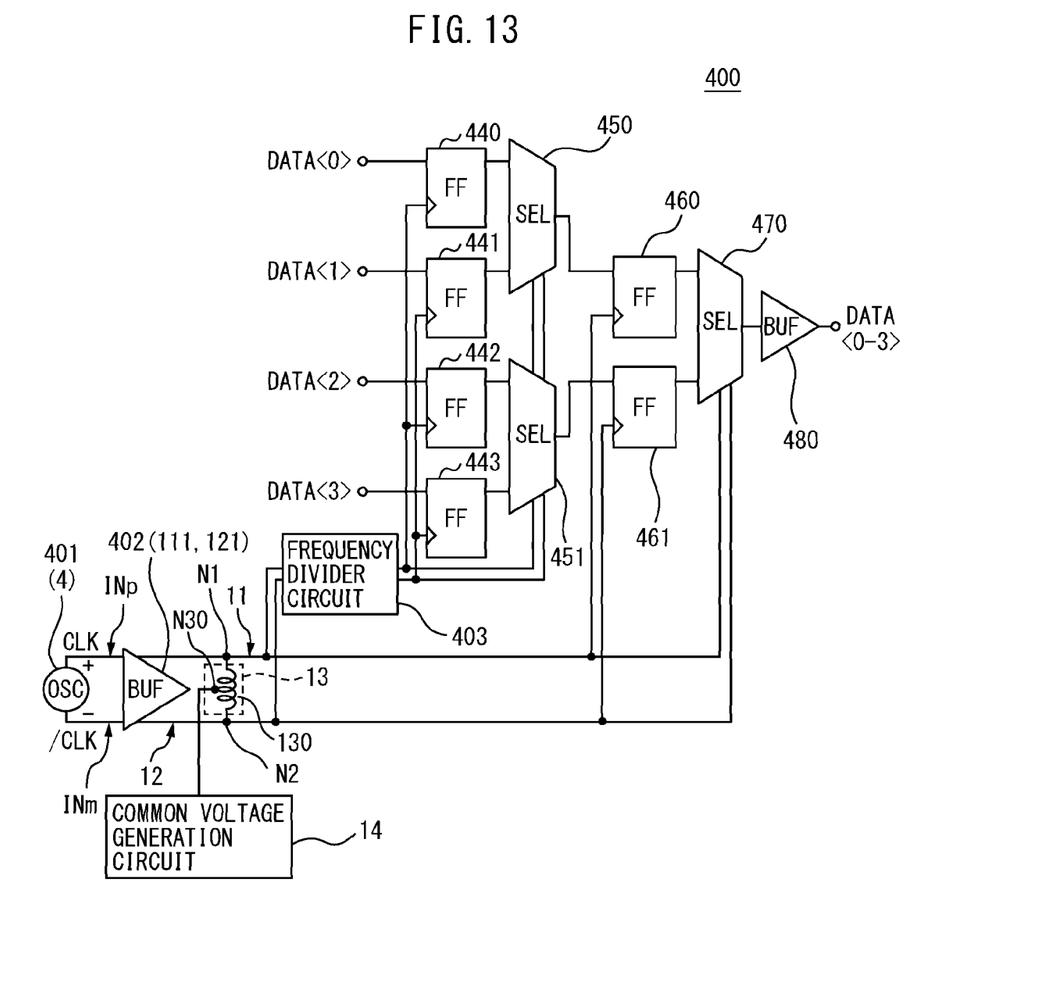
FIG. 13 is a block diagram illustrating an example of a semiconductor integrated circuit that is applied to the clock transmission circuit of the present embodiment.

FIG. 13 is a block diagram illustrating an example of a semiconductor integrated circuit to which the clock transmission circuit of the present embodiment is applied, and illustrates an example in which the clock transmission circuit of the present embodiment is applied to a serializer 400 that serializes four inputs into a single output.

As depicted in FIG. 13, the serializer 400 includes an oscillator (OSC) 401, a buffer 402, an inductor unit 13, a common voltage generation circuit 14, a frequency divider circuit 403, flip-flops (FFs) 440-443, 460, and 461, selectors (SEL) 450, 451, and 470, and a buffer (BUF) 480. The oscillator 401, for example, corresponds to the clock generation circuit 4 in FIG. 1, and the buffer 402, for example, corresponds to the buffers 111 and 121 in FIG. 5, FIG. 7, and FIG. 9 to FIG. 11.

The buffer 402 buffers the differential clocks CLK and /CLK outputted from the oscillator 401 and outputs them at the clock wirings 11 and 12. The output clocks of the buffer 402 are transmitted to the flip-flops 460 and 461 and the selector 470 via the clock wirings 11 and 12, and frequency divided (frequency divided by two) by the frequency divider circuit 403 and then transmitted to the flip-flops 440-443 and the selectors 450 and 451.

The flip-flops 440-443 fetch and hold, based on the low-speed clocks which are frequency divided by the frequency divider circuit 403, data signals DATA <0>-DATA<3> inputted in parallel respectively, and the data signals are inputted to the flip-flops 460 and 461 via the selectors 450 and 451 controlled with the low-speed clocks.

The flip-flops 460 and 461 fetch and hold the outputs of the selectors 450 and 451 with the output clocks (high-speed clocks) of the buffer 402, and the outputs of the selectors 450 and 451 are converted to serial data via the selector 470 which is controlled with the high-speed clocks. The output of the selector 470 is buffered by the buffer 480 and outputted as serial data output DATA <0-3>.

Incidentally, the clock transmission circuit of the present embodiment may be widely applied to various semiconductor integrated circuits, including the above-described serializer or the communication LSI described with reference to FIG. 1, and is especially suitable for semiconductor integrated circuits in which high-speed clocks at several GHz or higher are applied.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A clock transmission circuit comprising:
   a first buffer configured to receive a first clock which is one of differential clocks, and to buffer and output the first clock to a first clock wiring;
   a second buffer configured to receive a second clock which is the other of the differential clocks, and to buffer and output the second clock to a second clock wiring; and
   an inductor unit connected between a first node of the first clock wiring and a second node of the second clock wiring, and configured to include a center tap to which a common voltage is applied, wherein
   the inductor unit forms an inductor peaking circuit that parallel resonates with load capacitances of the first clock wiring and the second clock wiring.

2. The clock transmission circuit as claimed in claim 1, wherein the inductor unit includes:
   a first inductor, one end of the first inductor being connected to the first node; and
   a second inductor, one end of the second inductor being connected to the second node, wherein
     the first inductor and the second inductor include the same inductance,
     the other end of the first inductor and the other end of the second inductor are connected in common at a third node, and
     the common voltage is applied to the third node.

3. The clock transmission circuit as claimed in claim 2, wherein
   the first inductor and the second inductor are formed as a single inductor, and
   the third node is formed as a center tap of the single inductor.

4. The clock transmission circuit as claimed in claim 2, wherein
   the first inductor and the second inductor form the inductor peaking circuit that parallel resonates with the load capacitances of the first clock wiring and the second clock wiring.

5. The clock transmission circuit as claimed in claim 4, wherein
   the load capacitances include parasitic capacitances that are parasitic at the first clock wiring and the second clock wiring.

6. The clock transmission circuit as claimed in claim 1, the clock transmission circuit further comprising:
   a first capacitance element provided in series between an output of the first buffer and the first clock wiring; and
   a second capacitance element provided in series between an output of the second buffer and the second clock wiring.

7. The clock transmission circuit as claimed in claim 1, the clock transmission circuit further comprising:
   a common voltage generation circuit configured to generate the common voltage.

8. The clock transmission circuit as claimed in claim 1, the clock transmission circuit further comprising:
   a third buffer configured to receive the first clock via the first clock wiring, and to buffer and output the first clock;
   a fourth buffer configured to receive the second clock via the second clock wiring, and to buffer and output the second clock; and
   a common voltage generating circuit configured to receive output voltages of the third buffer and the fourth buffer, and generate the common voltage.

9. The clock transmission circuit as claimed in claim 8, wherein the common voltage generation circuit includes:
   a first resistance element, one end of the first resistance element being connected to an output wiring of the third buffer;
   a second resistance element, one end of the second resistance element being connected to an output wiring of the fourth buffer;
   a third capacitance element, one end of the third capacitance element being connected to a fixed potential wiring; and
   an operational amplifier configured to generate the common voltage by feeding back output voltages from a common connection node among other ends of the first and second resistance elements and other end of the third capacitance element.

10. The clock transmission circuit as claimed in claim 1, the clock transmission circuit further comprising:
    a third buffer configured to receive the first clock via the first clock wiring, and to buffer and output the first clock;
    a fourth buffer configured to receive the second clock via the second clock wiring, and to buffer and output the second clock;
    a fifth buffer which is smaller in size than the third buffer and provided in parallel with the third buffer, wherein the fifth buffer is configured to receive the first clock via the first clock wiring, and to buffer and output the first clock;
    a sixth buffer which is smaller in size than the fourth buffer and provided in parallel with the fourth buffer, wherein the sixth buffer is configured to receive the second clock via the second clock wiring, and to buffer and output the second clock; and
    a common voltage generation circuit configured to receive output voltages of the fifth buffer and the sixth buffer, and generates the common voltage.

11. The clock transmission circuit as claimed in claim 10, wherein
    the common voltage generation circuit includes:
      a first resistance element, one end of the first resistance element being connected to an output wiring of the fifth buffer;
      a second resistance element, one end of the second resistance element being connected to an output wiring of the sixth buffer;
      a third capacitance element, one end of the third capacitance element being connected to a fixed potential wiring; and
      an operational amplifier configured to generate the common voltage by feeding back voltages from a common connection node among other ends of the first and second resistance elements and other end of the third capacitance element.

12. The clock transmission circuit as claimed in claim 1, wherein the common voltage is set to a midpoint potential of the differential clocks.

13. The clock transmission circuit as claimed in claim 1, wherein the first buffer, the second buffer, and the inductor unit are formed in a single semiconductor chip.

14. The clock transmission circuit as claimed in claim 2, wherein the first buffer, the second buffer, and the first inductor and the second inductor are formed in a single semiconductor chip, and the first inductor and the second inductor are symmetrically structured.

15. A semiconductor integrated circuit comprising:
a clock transmission circuit; and
an internal circuit configured to receive differential clocks from the clock transmission circuit, wherein
the clock transmission circuit includes:
   a first buffer configured to receive a first clock which is one of the differential clocks, and to buffer and output the first clock to a first clock wiring;
   a second buffer configured to receive a second clock which is the other of the differential clocks, and to buffer and output the second clock to a second clock wiring; and
   an inductor unit connected between a first node of the first clock wiring and a second node of the second clock wiring, and configured to include a center tap to which a common voltage is applied, wherein
   the inductor unit forms an inductor peaking circuit that parallel resonates with load capacitances of the first clock wiring and the second clock wiring.

16. The semiconductor integrated circuit as claimed in claim 15, wherein the inductor unit includes:
   a first inductor, one end of the first inductor being connected to the first node; and
   a second inductor, one end of the second inductor being connected to the second node, wherein the first inductor and the second inductor include the same inductance, the other end of the first inductor and the other end of the second inductor are connected in common at a third node, and the common voltage is applied to the third node.

17. The semiconductor integrated circuit as claimed in claim 16, wherein the first inductor and the second inductor are formed as a single inductor, and the third node is formed as a center tap of the single inductor.

18. The semiconductor integrated circuit as claimed in claim 16, wherein the first inductor and the second inductor form the inductor peaking circuit that parallel resonates with the load capacitances of the first clock wiring and the second clock wiring.

19. The semiconductor integrated circuit as claimed in claim 15, wherein the clock transmission circuit further includes:
   a third buffer configured to receive the first clock via the first clock wiring, and to buffer and output the first clock; a fourth buffer configured to receive the second clock via the second clock wiring, and to buffer and output the second clock; and
   a common voltage generating circuit configured to receive output voltages of the third buffer and the fourth buffer, and generate the common voltage.

20. The semiconductor integrated circuit as claimed in claim 15, wherein the clock transmission circuit further includes:
   a third buffer configured to receive the first clock via the first clock wiring, and to buffer and output the first clock;
   a fourth buffer configured to receive the second clock via the second clock wiring, and to buffer and output the second clock;
   a fifth buffer which is smaller in size than the third buffer and provided in parallel with the third buffer, wherein the fifth buffer is configured to receive the first clock via the first clock wiring, and to buffer and output the first clock;
   a sixth buffer which is smaller in size than the fourth buffer and provided in parallel with the fourth buffer, wherein the sixth buffer is configured to receive the second clock via the second clock wiring, and to buffer and output the second clock; and
   a common voltage generation circuit configured to receive output voltages of the fifth buffer and the sixth buffer, and generates the common voltage.

21. The semiconductor integrated circuit as claimed in claim 16, wherein the first buffer, the second buffer, and the first inductor and the second inductor are formed in a single semiconductor chip, and the first inductor and the second inductor are symmetrically structured.

* * * * *